HIGH GAIN RADIO RECEIVER

Filed Jan. 7, 1960

INVENTOR
LEE P. KEY

BY Fisher Christen & Goodson
ATTORNEYS

United States Patent Office 3,077,562
Patented Feb. 12, 1963

3,077,562
HIGH GAIN RADIO RECEIVER

Lee P. Key, Broad Run Farms, Rte. 2, Sterling, Va.

Filed Jan. 7, 1960, Ser. No. 1,108
11 Claims. (Cl. 325—319)

Figure 1:
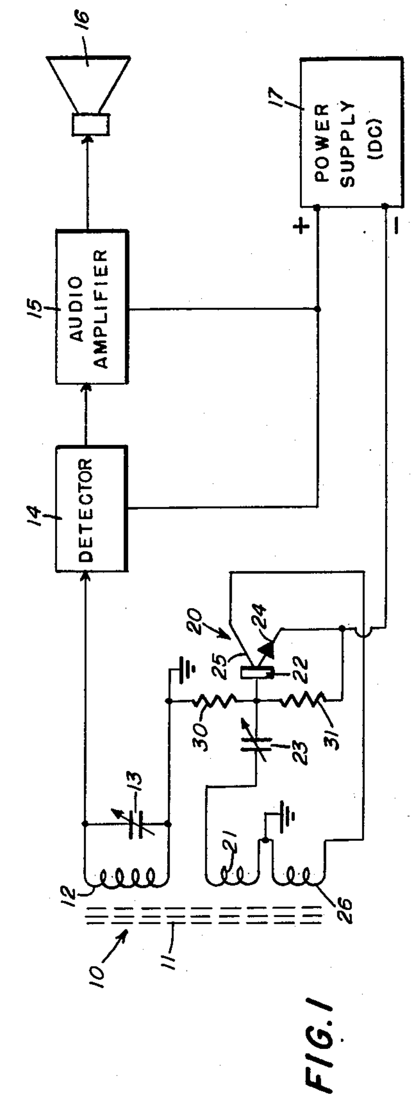

This invention relates generally to transistor circuits and more particularly to transistorized signal receiving circuits.

Tuned-radio-frequency receivers, generally known as T.-R.-F. receivers, have many desirable features and are particularly advantageous in that they require fewer component parts than do equivalent superheterodyne receivers. However, T.-R.-F. receivers have several disadvantages. The principal disadvantage is that the selectivity of the receiver does not remain constant over its tuning range, selectivity decreasing as the set is tuned toward its higher frequency range. Also, the amplification, or gain, of a T.-R.-F. receiver is not constant over the tuning range of the receiver since the gain depends on R.-F. transformer gain which increases with frequency. In order to overcome these deficiencies, it has been the practice to increase the number of R.-F. stages and gang the tuning capacitors of the several grid tank circuits on the same shaft. This, of course, increases the number of components and removes the major advantage of T.-R.-F. receivers.

Accordingly, it is an object of this invention to provide a signal receiving apparatus having high selectivity and sensitivity of the tuned radio frequency type without the disadvantages mentioned above.

A further object of the invention is to provide a T.-R.-F. receiver capable of extreme miniaturization.

A still further object of this invention is to provide a radio receiver which will operate from an extremely small power supply.

Yet another object of this invention is to provide a T.-R.-F. receiver wherein a single R.-F. amplifier is used which amplifies the signal and feeds it back into the antenna to reinforce the incoming signal.

Figure 2:
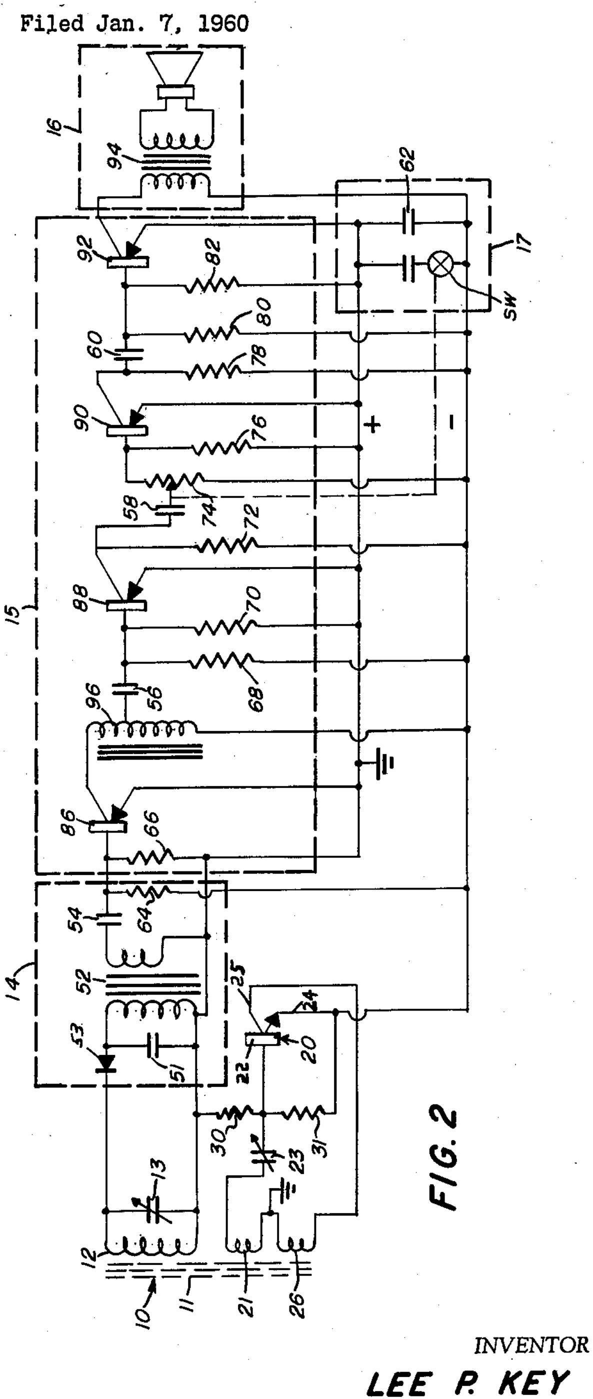

Further objects of the invention will become apparent from the following description when taken in connection with the accompanying drawings in which a preferred embodiment of the invention is shown in schematic form and showing a T.-R.-F. receiver employing the amplification principles of the present invention. In the drawings:

FIG. 1 is a schematic diagram showing the audio stages of amplification in block form; and FIG. 2 is a schematic diagram of the circuit showing the circuitry of the audio amplification stages.

Referring now more particularly to the drawings there is shown in FIG. 1 an R.-F. receiving antenna 10 having a ferrite coil 11 and a pickup coil 12 wound thereabout. A tuning capacitor 13 (which would have a tuning knob, not shown, attached and extending to a point without the radio housing) is connected across coil 12 to provide a tank circuit for selecting the desired frequency. The selected R.-F. frequency is passed through a detector 14, amplified by A.-F. amplifier 15 and with the resultant output being fed to speaker 16. The amplifier 15 may be comprised of any desired number of stages of transistorized amplification stages. In an operating embodiment (see FIG. 2) of the invention, four stages of audio amplification were used. The power supply for detector 14 and amplifier 15 is provided by a D.C. source as indicated.

There is shown in FIG. 2 the complete circuit diagram of the embodiment shown in FIG. 1 and includes the detail showing of the detector 14, amplifying stages 15, speaker 16 and power source 17. Included with power source 17 is a standard switch SW with a mechanical connection 41 to variable resistor 74 for providing the proper volume control.

In order to provide the necessary R.-F. amplification with a minimum of power, a transistor amplifier 20 is provided with the antenna system. When the antenna 10 is tuned to the desired frequency by tuning capacitor 13, the R.-F. signal is picked up by coil 21 and fed to the base 22 of transistor 20 through a variable coupling capacitor 23. In the particular embodiment shown, an NPN transistor has been used in the R.-F. amplification stage. The emitter 24 of transistor 20 is directly connected to the negative side of the D.C. power supply 17. The collector 25 of transistor 20 is directly connected to coil 26 which feeds the amplified R.-F. signal back into antenna 10. The signal supplied to the antenna by the amplifier, reinforces the incoming signal and tends to block the undesired frequencies. Thus, amplification is obtained without substantially reducing the selectivity of the receiver over the operating frequency range.

The following circuit parameters have been found to be practical in this particular embodiment of the invention:

| | |
|---|---|
| Coil **11** (iron powder core) | Length 7½", dia. ½". |
| Coil **12** | 65 turns. |
| Coil **21** | 4 turns. |
| Coil **26** | 6 turns. |
| Capacitor **13** | 365 mmf. |
| Capacitor **23** | 600 mmf. |
| Resistor **30** | 22K ohms. |
| Resistor **31** | 6800 ohms. |
| Power supply **17** | Z type battery 1½ volts (one pen cell). |
| Capacitor **51** | 1000 mmf. |
| Capacitor **54** | 2 mfd. |
| Capacitor **56** | 2 mfd. |
| Capacitor **58** | 2 mfd. |
| Capacitor **60** | 2 mfd. |
| Capacitor **62** | 10 mfd. |
| Resistance **64** | 150K ohms. |
| Resistance **66** | 22K ohms. |
| Resistance **68** | 220K ohms. |
| Resistance **70** | 30K ohms. |
| Resistance **72** | 2700K ohms. |
| Resistance **74** | 80K ohms (variable). |
| Resistance **76** | 6900 ohms. |
| Resistance **78** | 390 ohms. |
| Resistance **80** | 33K ohms. |
| Resistance **82** | 30K ohms. |
| TR **84** | Audio. |
| TR **86** | Audio. |
| TR **88** | Audio. |
| TR **90** | Audio. |
| TR **92** | Audio. |
| Transformer **94** | Output PRI 500 ohms, sec 3.2 IMP. |
| Transformer **96** | 30K IMP TAP, IK IMP. |
| Transformer **52** | 100K IMP IN IK IMP OUT. |

The values of the parts listed are shown to give a true disclosure of the circuitry. It is to be understood that the parts may vary as to type and value as long as the circuit relationships remain substantially the same.

Referring to the detector circuitry, the diode 53 should be given particular attention. For theoretical reasons, not at the present time fully understood, it should be of a very sensitive type. A 2N233 has been found to be adequate for the purpose. Apparently the sensitive diode 53 prevents the amplified signal from creating undesirable oscillations within the R.F. circuitry.

A factor which aids in reducing unwanted oscillations in the audio circuitry is the fact that resistors 68, 70, 72, 76, 78, 80 and 82 are connected to ground. This connection provides enough load to dampen oscillations but does not seriously effect gain for practical purposes.

As can be seen, this invention provides an extremely compact T.-R.-F. receiver which operates on a very low power supply. Additionally, the advantages of the T.-R.-F. receiver have been retained, but the disadvantages hitherto inherent in such receivers have been substantially eliminated. By providing regenerative amplification of the R.-F. signal within the antenna the necessary gain has been attained without substantially reducing the selectivity of the device over its operating range of frequencies.

While there has been shown and described a preferred embodiment of the invention, it will be understood by those skilled in the art that various modifications and changes and substitution of equivalents may be made therein within the true scope of the invention as defined by the appended claims.

I claim:

1. In a radio receiver, a coil antenna, means for tuning said antenna to a signal of a selected frequency, independent amplifying means inductively coupled to said antenna and responsive to said selected frequency, and inductive means coupled to the output of said amplifying means for providing a reinforcing signal to said antenna and transducing means connected to the output of said coil antenna.

2. The apparatus of claim 1 wherein said antenna comprises a ferrite core about which a coil is wound.

3. The apparatus of claim 2 wherein said tuning means comprises a variable capacitor connected across said coil.

4. The apparatus of claim 3 wherein said means coupled to the output of said amplifying means comprises coils wound about said ferrite core.

5. A radio receiving apparatus comprising a ferrite coil first, second and third coils wound about said coil, a variable capacitor connected across said first coil, a transistor amplifier having its input coupled to said first and second coils and its output connected to said third coil, a diode connected to the output of said first coil, detector means connected to the output of said first diode, amplifying means connected to the output of said detector means, transducer means connected to the output of said amplifying means and a direct current source connected to said transistor amplifier, said detector means and said amplifying means.

6. In a signal receiving apparatus, a ferrite rod antenna having a first coil wound thereon, a variable capacitor connected across said coil, a second coil wound about said rod and coupled to said capacitor, a third coil wound about said rod and coupled to said first coil, a transistor amplifier connected between said second and third coils and transducer means connected to said first coil.

7. In a radio receiver, a ferrite coil, first, second and third coils wound about said ferrite coil, a variable capacitor connected across said first coil, a transistor amplifier coupled to said first coil and connected across said second and third coils, a power source connected to said amplifier, and transducing means connected to said first coil.

8. A radio receiving apparatus comprising a ferrite core, first, second and third mutually coupled coils wound about said core, a variable capacitor connected across said first coil, a transistor amplifier having its input coupled to said first and second coils and its output coupled to said third coil, detector means connected to the output of said first coil, amplifying means connected to the output of said detector means, transducer means connected to the output of said amplifying means and a direct current source connected to said transistor amplifier, said detector means and said amplifying means.

9. In a signal transducer including an antenna, tuning means coupled to said antenna for selecting a signal of a desired frequency, transducing means coupled to said tuning means, amplifying means coupled directly to said tuning means and responsive to said selected frequency, and means coupled to said amplifying means and associated with said antenna for providing a reinforcing signal to said tuning means.

10. In a signal transducer, an antenna, tuning means coupled to the output of said antenna for selecting a signal of a desired frequency, amplifying means coupled directly to said tuning means and responsive to said selected frequency, and means coupled between said amplifying means and said tuning means for providing a reinforcing signal to said tuning means, detector means connected to the output of said amplifying means, and second amplifying means connected to said detector means, said second amplifying means comprising a plurality of stages of transistor amplification, each of said stages having base resistors connected to ground.

11. A radio receiver comprising an antenna, tuning means connected to said antenna, transducing means connected to said tuning means for producing an audio signal, amplifying means connected to said tuning means for amplifying the radio frequency signal selected by said tuning means and means connected to the output of said amplifying means and coupled to said antenna for reinforcing said radio frequency signal.

References Cited in the file of this patent

UNITED STATES PATENTS

| | | |
|---|---|---|
| 1,945,244 | Whitaker | Jan. 30, 1934 |
| 2,125,982 | Belleville | Aug. 9, 1938 |
| 2,183,748 | Kreienfeld | Dec. 19, 1939 |
| 2,802,938 | Herzog | Aug. 13, 1957 |
| 2,821,625 | Price | Jan. 28, 1958 |
| 2,851,592 | Webster | Sept. 9, 1958 |
| 2,873,359 | Cooper et al. | Feb. 10, 1959 |
| 2,968,802 | Flory et al. | Jan. 17, 1961 |

OTHER REFERENCES

Bohr: "Transistor Regenerator," Radio-Electronics, Aug. 1956, pages 34 to 36.

Sullivan: "Transistor Radio Uses Few Parts," Electronics, Jan. 3, 1958, pages 90 and 92.